(12) United States Patent
Huang et al.

(10) Patent No.: US 10,157,776 B2
(45) Date of Patent: Dec. 18, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yan-Jhi Huang, Yilan County (TW); Yu-Yu Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,444

(22) Filed: Nov. 1, 2017

(65) Prior Publication Data

US 2018/0269100 A1  Sep. 20, 2018

Related U.S. Application Data

(60) Provisional application No. 62/471,700, filed on Mar. 15, 2017.

(51) Int. Cl.
*H01L 21/768* (2006.01)
*H01L 21/033* (2006.01)

(52) U.S. Cl.
CPC .... *H01L 21/76816* (2013.01); *H01L 21/0332* (2013.01); *H01L 21/0335* (2013.01); *H01L 21/0337* (2013.01); *H01L 21/0338* (2013.01); *H01L 21/76829* (2013.01); *H01L 21/76877* (2013.01)

(58) Field of Classification Search
CPC .......... H01L 21/76816; H01L 21/0337; H01L 21/76829; H01L 21/0338; H01L 21/0335; H01L 21/0332; H01L 21/76877
See application file for complete search history.

(56) References Cited

U.S. PATENT DOCUMENTS

| | | | |
|---|---|---|---|
| 2015/0243518 A1* | 8/2015 | deVilliers | H01L 21/0337 438/692 |
| 2016/0225666 A1* | 8/2016 | Bouche | H01L 21/31144 |
| 2016/0307769 A1* | 10/2016 | Tseng | H01L 21/31144 |

* cited by examiner

*Primary Examiner* — Duy Vu N Deo
(74) *Attorney, Agent, or Firm* — McDermott Will & Emery LLP

(57) ABSTRACT

A method for manufacturing a semiconductor device includes forming a hard mask layer overlying a device layer of a semiconductor device, a mandrel underlayer over hard mask layer, and a mandrel layer over mandrel underlayer. The mandrel layer has a plurality of mandrel lines extending along a first direction. A plurality of openings are formed in mandrel underlayer extending in a second direction substantially perpendicular to first direction. A spacer layer is formed over mandrel underlayer and layer. Spacer layer fills plurality of openings in underlayer. Portions of spacer layer are removed to expose an upper surface of underlayer and mandrel layer, and mandrel layer is removed. By using remaining portions of spacer layer as a mask, underlayer and hard mask layer are removed, to form a hard mask pattern with first hard mask pattern lines extending along first direction and second hard mask pattern lines extending along second direction.

20 Claims, 18 Drawing Sheets

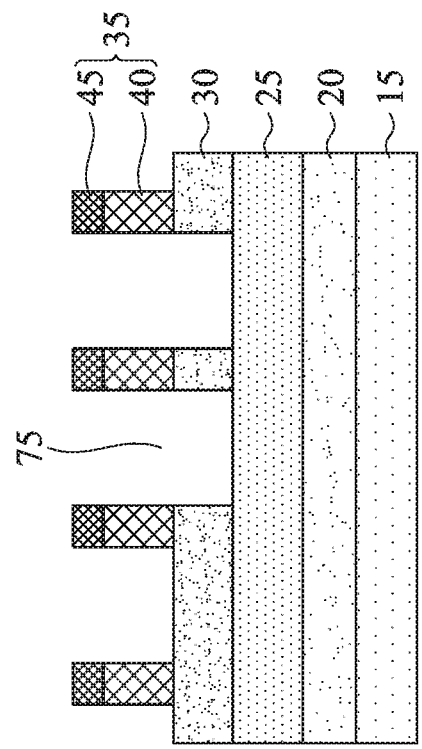
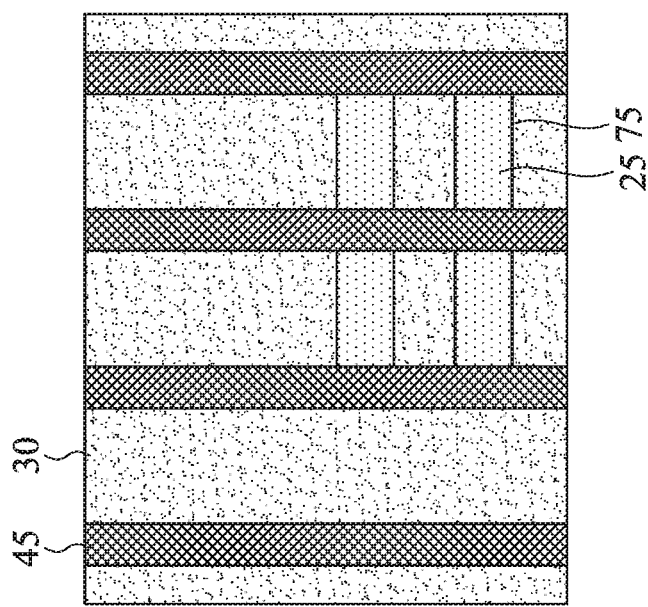
FIG. 5C
FIG. 5B

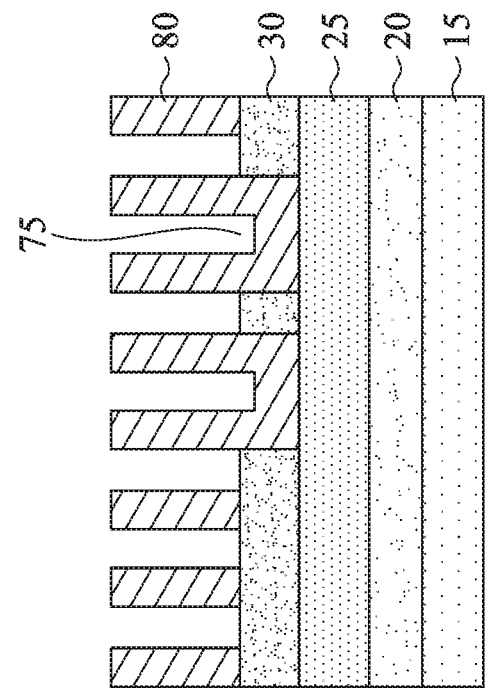
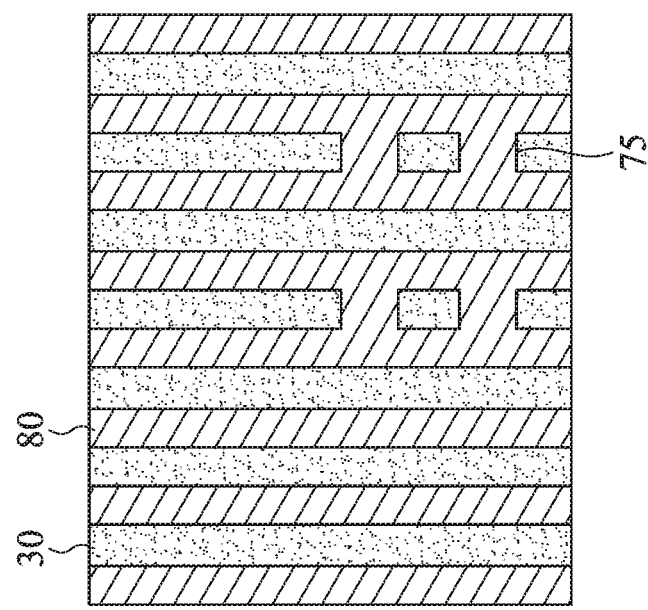
FIG. 9C
FIG. 9B

SEMICONDUCTOR DEVICE AND MANUFACTURING METHOD THEREOF

CROSS-REFERENCE TO RELATED APPLICATIONS

This application claims priority to U.S. Provisional Patent Application 62/471,700 filed Mar. 15, 2017, the entire disclosure of which is incorporated herein by reference.

TECHNICAL FIELD

The disclosure relates to semiconductor integrated circuits, and more particularly to wiring layers and interconnects overlying semiconductor devices and their manufacturing processes.

BACKGROUND

As feature densities in semiconductor devices increase, the widths of the conductive lines, and the spacing between the conductive lines of back-end of line (BEOL) interconnect structures in the semiconductor devices also need to be scaled down. At 5 nm/7 nm nodes and beyond, the varying topography of deposited film caused by the density of underlying lines and devices makes conventional BEOL interconnect processing more difficult. Due to the varying topography, when filling insulating material into spacer openings formed by photolithographic operations, the amount of insulating material may vary. If too little insulating material is filled in the spacer openings, a short circuit may be caused in subsequent interconnect formation operations. If too much insulating material is filled in the spacers, then disconnects may be formed in subsequent interconnect formation operations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5B is a plan view of the stage of the sequential process depicted in FIG. 5A. FIG. 5C is a cross-sectional view of the stage of the sequential process according to line D-D of FIG. 5A.

FIG. 9B is a plan view of the stage of the sequential process depicted in FIG. 9A. FIG. 9C is a cross-sectional view of the stage of the sequential process according to line H-H of FIG. 9A.

DETAILED DESCRIPTION

Figure 1:
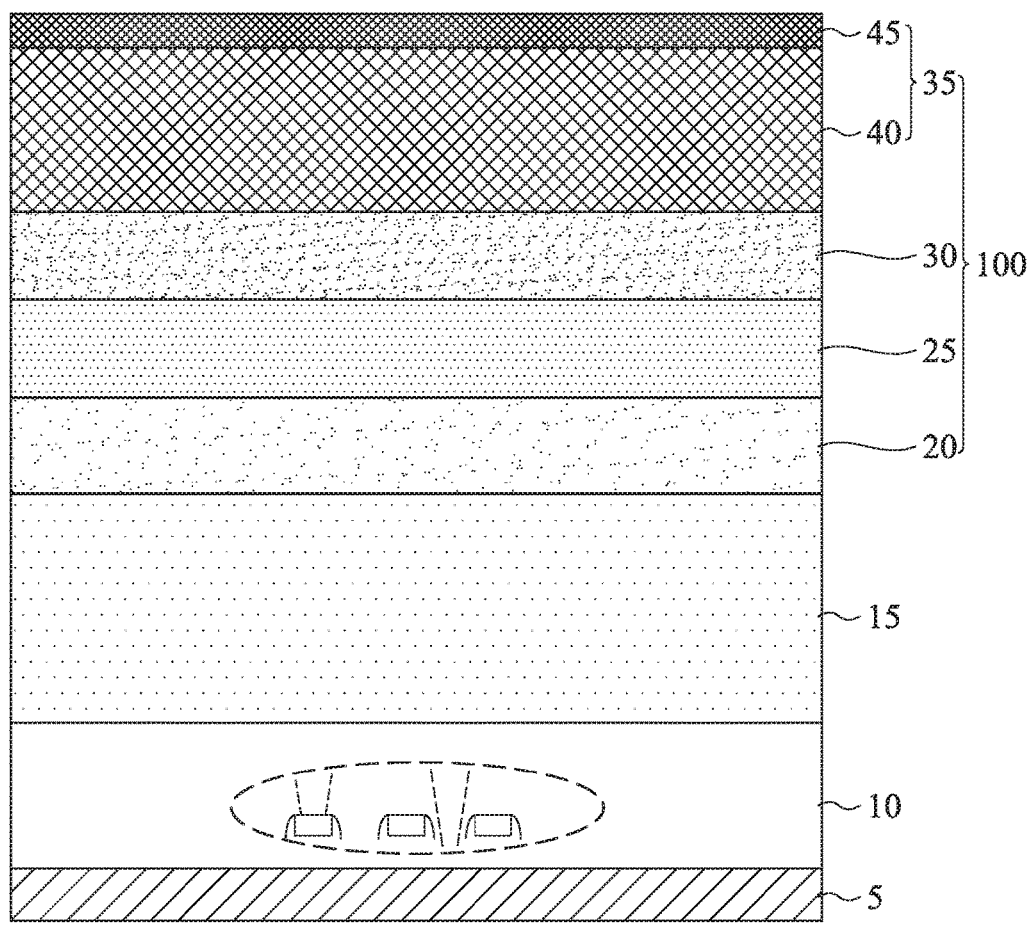
FIG. 1 is cross-sectional view of one stage of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure are directed to line cuts of hard mask patterning. With technology evolving, the line cut process becomes more challenging and is important to product yield control. An underlayer merge cut approach according to the present disclosure improves the hard mask pattern process window. The underlayer merge cut process according to the present disclosure is described herein.

Various embodiments of the disclosure relate to semiconductor devices and methods for forming the same. In various embodiments, the semiconductor device includes FinFET and other MOS transistors. FinFET transistors are field effect transistors formed on fin structures formed over a substrate. In some embodiments, the fins are formed in an array. In some embodiments, the semiconductor device includes gate-all-around field effect transistors (GAA FET).

The semiconductor devices include interconnect structures that include a plurality of interconnect pattern (line) layers having conductive patterns and interconnecting various features in one portion of the semiconductor device to other features of the die. The interconnect structures are formed of conductive materials such as metal and the semiconductor devices include several interconnect layers in various levels (heights). The interconnect layers are often referred to as "metal 1" or "M1 " (designating the lowermost interconnect level), "metal 2", "metal 3", and so on. These designations are well known and used in the art to indicate that the conductive lines interconnect features from various locations in the semiconductor device. In some embodiments, the metal interconnect lines connect an array of FinFET to other arrays or other features. The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments.

FIGS. 1-10C show exemplary sequential processes for manufacturing semiconductor devices according to an embodiment of the present disclosure. It is understood that additional operations can be provided before, during, and after processes shown by FIGS. 1-10C, and some of the operations described below can be replaced or eliminated, for certain embodiments of the method. The order of the operations/processes may be interchangeable.

As shown in FIG. 1, which is a cross-sectional view of one stage of a sequential process for manufacturing a semiconductor device according to an embodiment of the present disclosure, an interlayer dielectric layer 15 is formed over a device layer 10 having one or more devices embedded therein, on a semiconductor substrate 5. A layer stack 100 is formed over an interlayer dielectric layer 15. The layer stack 100 includes in order from the interlayer dielectric layer 15: an etch stop layer 20, a hard mask layer 25, a mandrel underlayer 30, and a mandrel layer 35.

In some embodiments, the substrate 5 includes a single crystalline semiconductor layer on at least it surface portion. The substrate 5 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 5 is made of crystalline Si.

In some embodiments, the device layer 10 includes devices, such as, for example, static random access memory (SRAM) and/or other logic circuits, passive components such as resistors, capacitors, and inductors, and active components such as P-channel field effect transistors (PFETs), N-channel FETs (NFETs), metal-oxide semiconductor field effect transistors (MOSFETs), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device, except as specifically claimed.

The interlayer dielectric (ILD) layer 15 is formed of materials including Si, O, C, N, and/or H, such as silicon oxide, silicon nitride, SiCOH, SiOC, phosphosilicate glass (PSG), borophosphosilicate glass (BPSG), fluorosilicate glass (FSG), spin-on-glass (SOG), and cominations thereof, in some embodiments. In other embodiments, organic materials, such as polymers, may be used for the ILD layer 15. The ILD layer may be formed by any suitable method, including spin-on coating, chemical vapor deposition (CVD), and plasma-enhanced CVD (PECVD).

An etch stop layer 20 is disposed over the ILD layer 15 in some embodiments. The etch stop layer 20 may include any known etch stop material, including a silicon oxide, silicon nitride, silicon oxynitride, aluminum oxide, aluminum nitride, aluminum fluoride, titanium nitride, tantalum oxide, magnesium fluoride, and titanium silicon nitride. The etch stop layer may be formed by any suitable method, including CVD, PECVD, atomic layer deposition (ALD), and a physical vapor deposition (PVD) operation, such as sputtering.

A hard mask layer 25 is disposed over the etch stop layer 20 in some embodiments. The hard mask layer 25 may include any suitable hard mask material, including oxides or nitrides, such as silicon oxide, silicon nitride, titanium oxide, titanium nitride, and SiOC. The hard mask layer 25 may be formed by any suitable method, including CVD, PECVD, ALD, and PVD. A thickness of the metal hard mask layer 25 ranges from about 10 nm to about 50 nm in some embodiments.

A mandrel underlayer 30 is disposed over the hard mask layer 25 in some embodiments. The mandrel underlayer 30 may include an oxide or nitride, such as silicon oxide, silicon nitride, titanium oxide, or titanium nitride. The mandrel underlayer 30 may be formed by any suitable method, including CVD, PECVD, ALD, and PVD. A thickness of the mandrel underlayer 30 ranges from about 10 nm to about 50 nm in some embodiments.

A mandrel layer 35 is disposed over the mandrel underlayer 30 in some embodiments. The mandrel layer 35 may include an amorphous silicon, amorphous carbon, aluminum oxynitride, silicon oxide, silicon nitride, aluminum oxide, silicon oxycarbide, SiCOH, or combinations thereof. The mandrel layer 35 may be formed by any suitable method, including CVD, PECVD, ALD, and PVD. A thickness of the mandrel layer 35 ranges from about 50 nm to about 1500 nm in some embodiments.

In some embodiments, the mandrel layer 35 includes a first mandrel layer 40 and a second mandrel layer 45 formed over the mandrel underlayer 30. In some embodiments, the first mandrel layer 40 is formed of an amorphous material, such as amorphous carbon and amorphous silicon, and aluminum oxynitride, and combinations thereof. The thickness of the first mandrel layer 40 ranges from about 25 nm to about 1400 nm in some embodiments. In some embodiments, the second mandrel layer 45 is formed of silicon oxide, silicon nitride, aluminum oxide, silicon oxycarbide, SiCOH, or combinations thereof. The thickness of the second mandrel layer 40 ranges from about 25 nm to about 1000 nm in some embodiments.

Figure 2B:
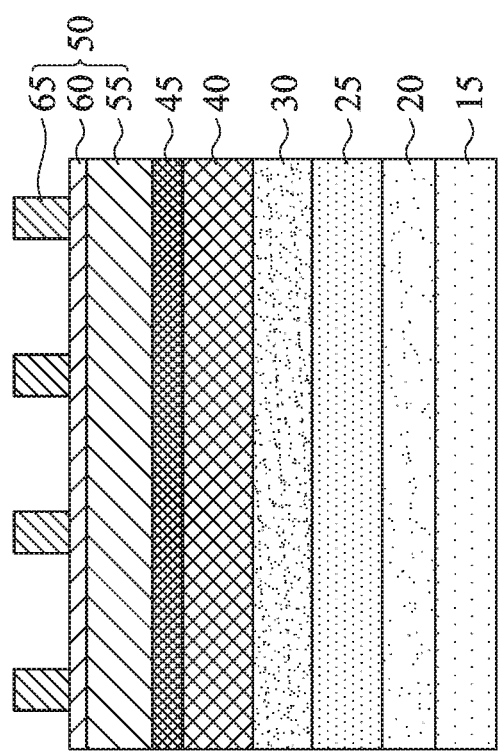
FIG. 2B is a cross-sectional view of the stage of the sequential process according to line A-A of FIG. 2A.
Figure 2A:
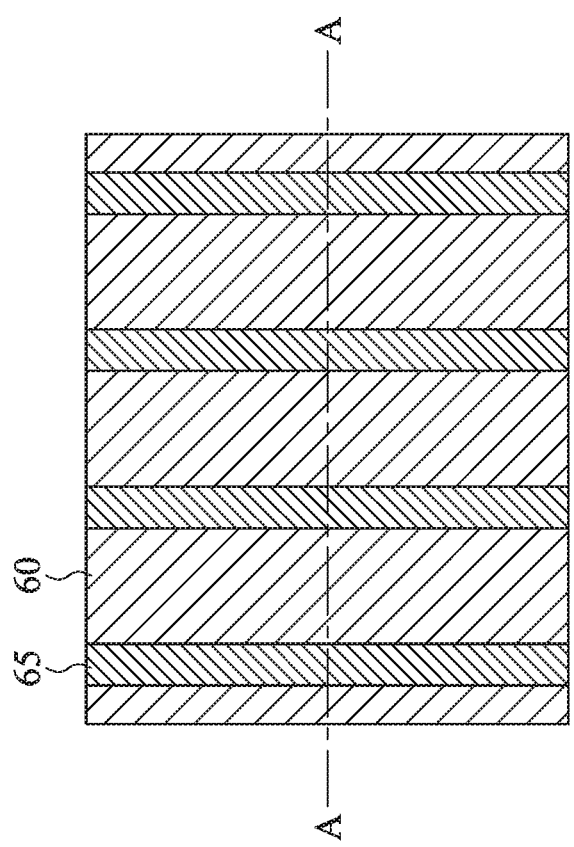
FIG. 2A is a plan view of one stage of a sequential process for manufacturing a semiconductor device according to an embodiment of the present disclosure.

FIG. 2A is a plan view of one stage of a sequential process for manufacturing a semiconductor device according to an embodiment of the present disclosure. FIG. 2B is a cross-sectional view of the stage of the sequential process according to line A-A of FIG. 2A.

As shown in FIGS. 2A and 2B, a first resist layer 50 is formed over the layer stack. To simplify the disclosure the lower layers of the semiconductor device, including the substrate layer 5 and device layer 10, are not shown in the remaining views.

In some embodiments, the first resist layer 50 is a trilayer resist including a bottom layer 55, middle layer 60, and an upper layer 65. In some embodiments, the bottom layer 55 is an organic material having a substantially planar upper surface, the middle layer 60 is an anti-reflective layer, and the upper layer 65 is a photoresist. The photoresist upper layer 65 is patterned using suitable photolithographic operations, as shown in FIGS. 2A and 2B.

In some embodiments, the bottom layer 55 is organic. The organic material may include a plurality of monomers or polymers that are not cross-linked. In some embodiments, the bottom layer 55 contains a material that is patternable and/or have a composition tuned to provide anti-reflection properties. Exemplary materials for the bottom layer 55 include carbon backbone polymers. The bottom layer 55 is used to planarize the structure, as the underlying structure may be uneven depending on the structure of the devices in the device layer 10. In some embodiments, the bottom layer 55 is formed by a spin coating process. In other embodiments, the first bottom layer 55 is formed by another suitable deposition process. In certain embodiments, the thickness of the bottom layer 55 ranges from about 50 nm to about 500 nm.

The middle layer 60 of the multilayer resist structure may have a composition that provides anti-reflective properties for the photolithography operation and/or hard mask properties. In some embodiments, the middle layer 60 includes a silicon containing layer (e.g., a silicon hard mask material). The middle layer 60 may include a silicon-containing inorganic polymer. In other embodiments, the middle layer includes a siloxane polymer. In other embodiments, the middle layer 60 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 60 may be bonded to adjacent layers, such as by covalent bonding, hydrogen bonding, or hydrophilic-to-hydrophilic forces.

Thus, the middle layer 60 may include a composition that allows for a covalent bond to be formed between the middle layer and the overlying photoresist 60 after an exposure process and/or subsequent baking process. In some embodiments, the middle layer 60 includes an additive compound or component having a photo base generator (PBG). This PBG generates a base that interacts with the exposed photoresist and provides for covalent bonding between the middle layer and a component of the overlying photoresist. In some embodiments, the middle layer 60 comprises a siloxane polymer and a PBG.

Exemplary photo-base generators include components that generate amines and sulfur (sulfur ions S—) bases. Other PBGs include carbamates, O-acyloximes, ammonium salts, amineimides, α-aminoketones, amidine precursors, aromatic ureas, and trimethylbenzhydrylammonium iodide.

The middle layer 60 may be formed by a spin-on coating process, chemical vapor deposition process (CVD), physical vapor deposition (PVD) process, and/or other suitable deposition processes. The thickness of the middle layer 60 ranges from about 20 nm to about 100 nm in some embodiments.

The photoresist upper layer 65 may be a photosensitive layer which can be patterned by actinic radiation, as known in the art. Typically, the chemical properties of the photoresist regions struck by incident radiation change in a manner that depends on the type of photoresist used. In some embodiments, the photoresist layer 65 is a positive resist. Positive resist refers to a photoresist material that when exposed to radiation (typically UV light) becomes soluble in a developer, while the portion of the photoresist that is non-exposed (or exposed less) is insoluble in the developer. In other embodiments, the photoresist layer 65 is a negative resist. Negative resist refers a photoresist material that when exposed to radiation becomes insoluble in the developer, while the portion of the photoresist that is non-exposed is soluble in the developer.

The photoresist layer 65 may include a carbon backbone polymer, and other suitable components such as a solvent and/or photo acid generators. For example, in some embodiments, the photoresist layer 65 is a known chemical amplified resist. The thickness of the photoresist upper layer 65 ranges from about 50 nm to about 400 nm in some embodiments.

In some embodiments, after coating, a soft bake process is performed on the photoresist layer 65. The photoresist layer 65 is subsequently exposed to actinic radiation in a patternwise manner thereby forming a latent image in the photoresist layer 65. The actinic radiation may be generated by a lithography system that provides a pattern of the radiation according to an integrated circuit design layout. In some embodiments, a lithography system includes ultraviolet (UV) radiation, deep ultraviolet (DUV) radiation, extreme ultraviolet (EUV) radiation, X-ray radiation, and/or other suitable radiation types. In alternative embodiments, a lithography system includes a charged particle lithography system, such as an electron beam or an ion beam lithography system.

In some embodiments, after the exposure operation, a hard baking operation occurs. The exposed photoresist layer 65 is subsequently developed to form a pattern, as depicted in FIGS. 2A and 2B, by applying a developer to the exposed photoresist layer 65. The developer is a solvent, and may be sprayed on the exposed photoresist film. The pattern depicted in FIGS. 2A and 2B is for illustrative purposes. The pattern according to the present disclosure is not limited to any specific pattern.

The pattern in the photoresist upper layer 65 may be subsequently transferred to the other layers of the multilayer resist structure using conventional photolithography operations. The pattern is subsequently extended into the mandrel layer 35, using suitable etching operations and the resist layers are removed using suitable resist removal operations for each resist layer.

Figure 3A:
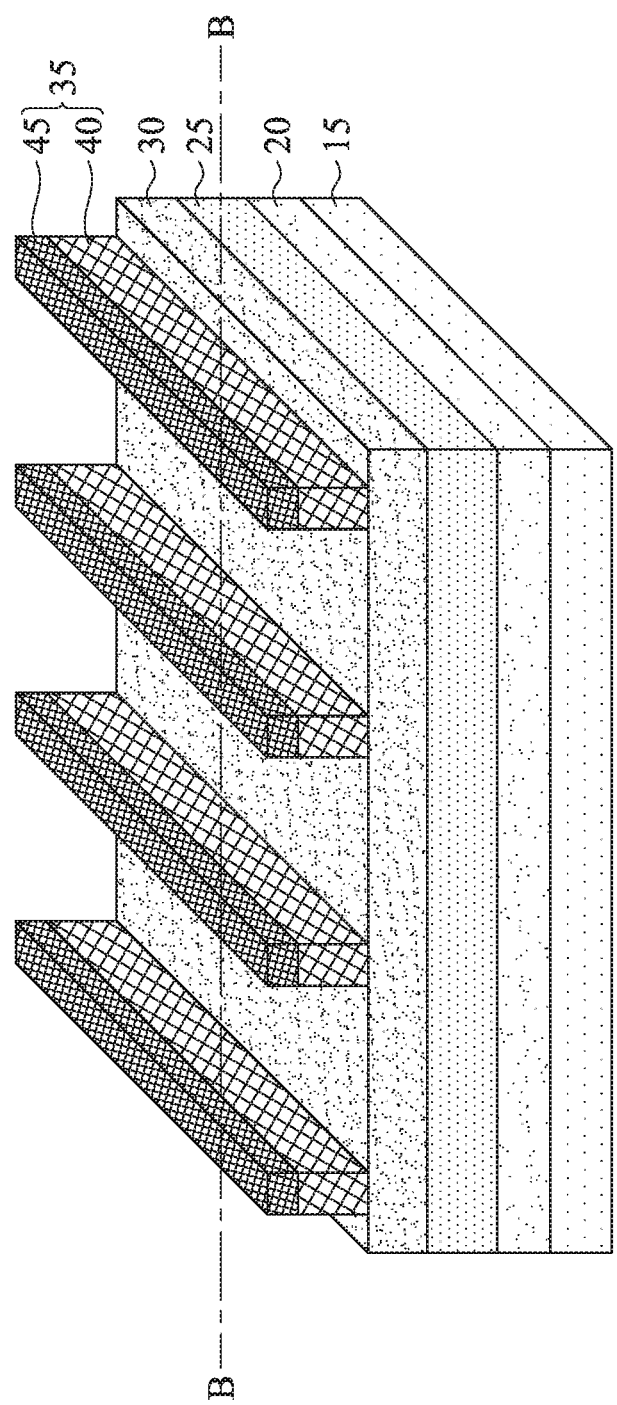
FIG. 3A is an isometric view of one stage of a sequential process for manufacturing a semiconductor device according to an embodiment of the present disclosure.
Figure 3B:
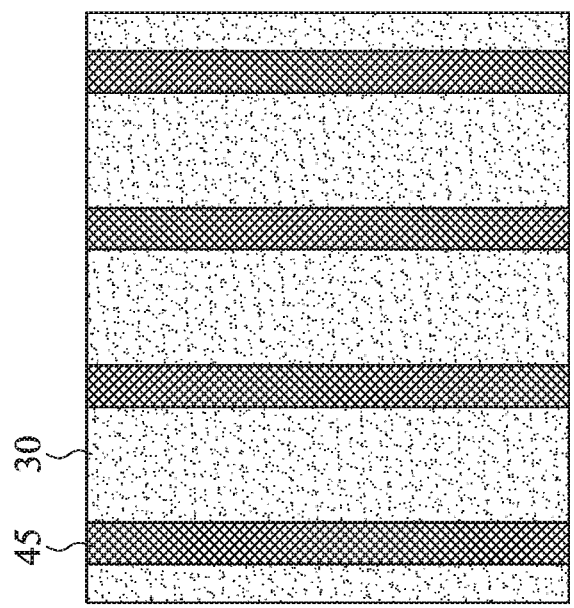
FIG. 3B is a plan view of the stage of the sequential process depicted in FIG. 3A.
Figure 3C:
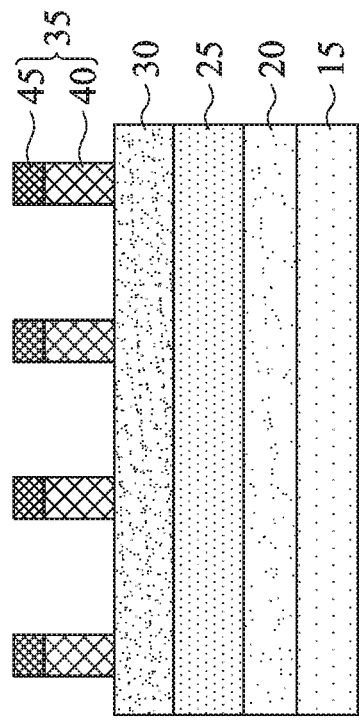
FIG. 3C is a cross-sectional view of the stage of the sequential process according to line B-B of FIG. 3A.

In some embodiments, the pattern in the photoresist upper layer 65 is extended through the mandrel layer 35, thereby forming a plurality of mandrel lines 35 extending in a first direction, as shown in FIGS. 3A-3C. In some embodiments, the mandrel layer 35 includes a first mandrel layer 40 and a second mandrel layer 45 formed over the mandrel underlayer 30. In some embodiments, the first mandrel layer 40 is formed of an amorphous material, such as amorphous carbon and amorphous silicon, and aluminum oxynitride, and combinations thereof. The thickness of the first mandrel layer 40 ranges from about 25 nm to about 1400 nm in some embodiments. In some embodiments, the second mandrel layer 45 is formed of silicon oxide, silicon nitride, aluminum oxide, silicon oxycarbide, SiCOH, or combinations thereof. The thickness of the second mandrel layer 40 ranges from about 25 nm to about 1000 nm in some embodiments.

The mandrel lines 35 are formed by one or more suitable etching operations using the resist layer 50 as a mask. The one or more etching operations may include wet etching operations, anisotropic dry etching operations, or combinations thereof. In some embodiments, the etching of the mandrel layer 35 is a dry etching operation using etch process gases including $O_2$, $CO_2$, $C_xH_yF_z$, Ar, $N_2$, $H_2$, HBr, $Cl_2$, and combinations thereof.

Figure 4A:
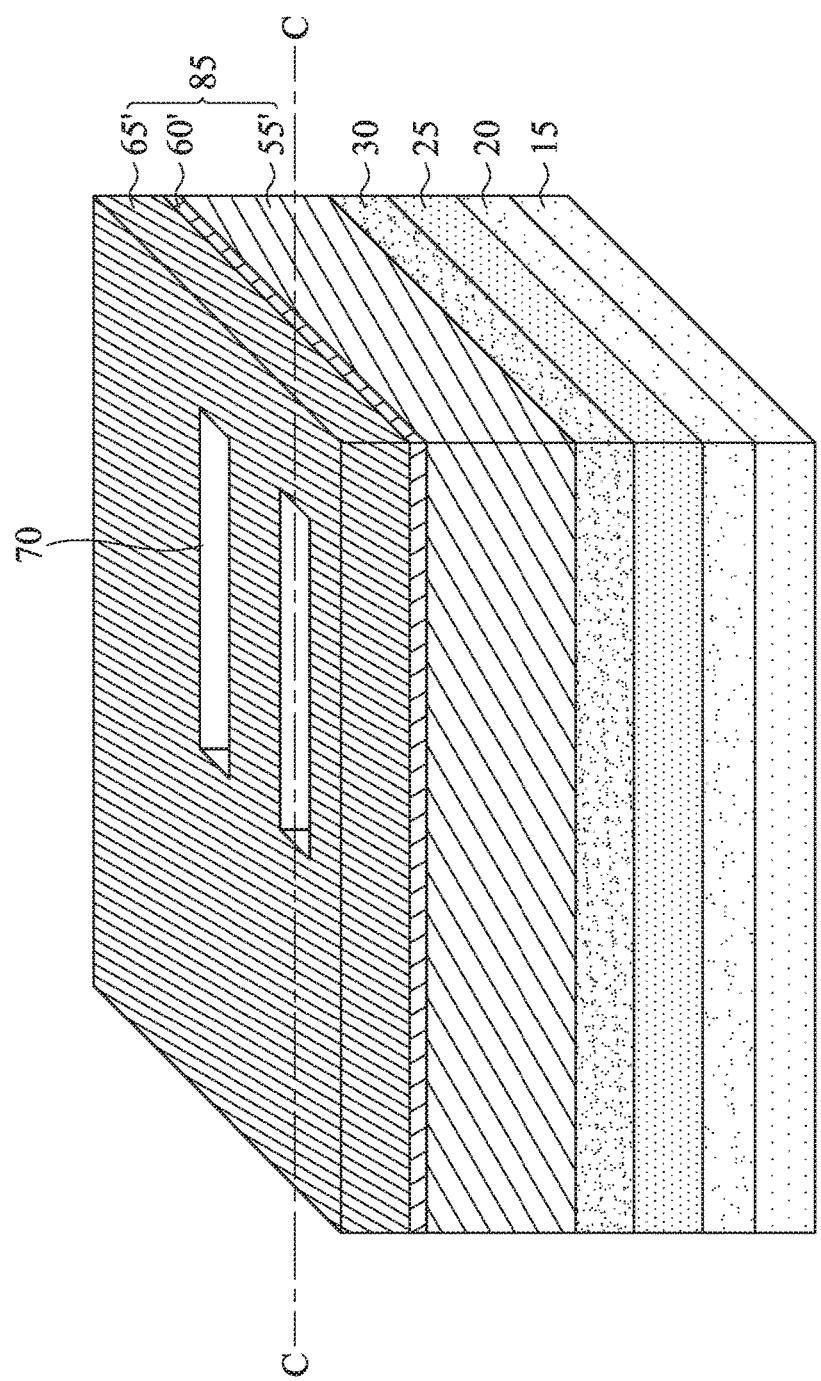
FIG. 4A is an isometric view of one stage of a sequential process for manufacturing a semiconductor device according to an embodiment of the present disclosure.
Figure 4C:
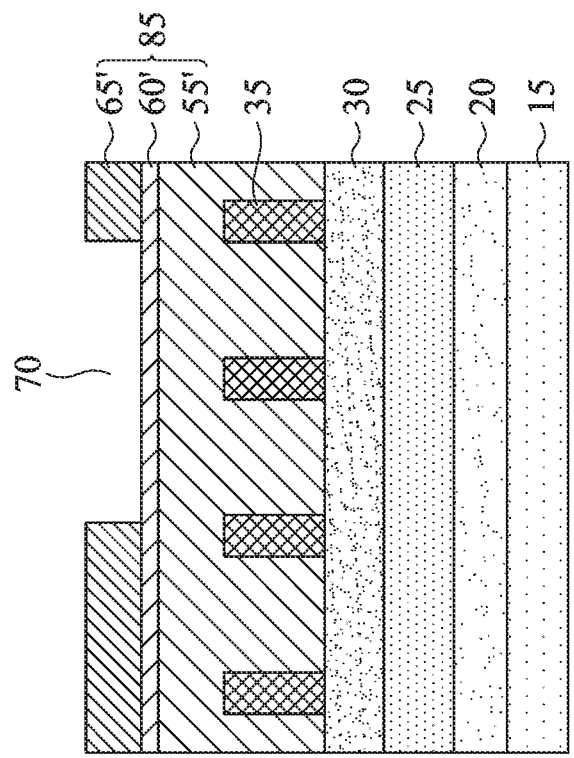
FIG. 4C is a cross-sectional view of the stage of the sequential process according to line C-C of FIG. 4A.
Figure 4B:
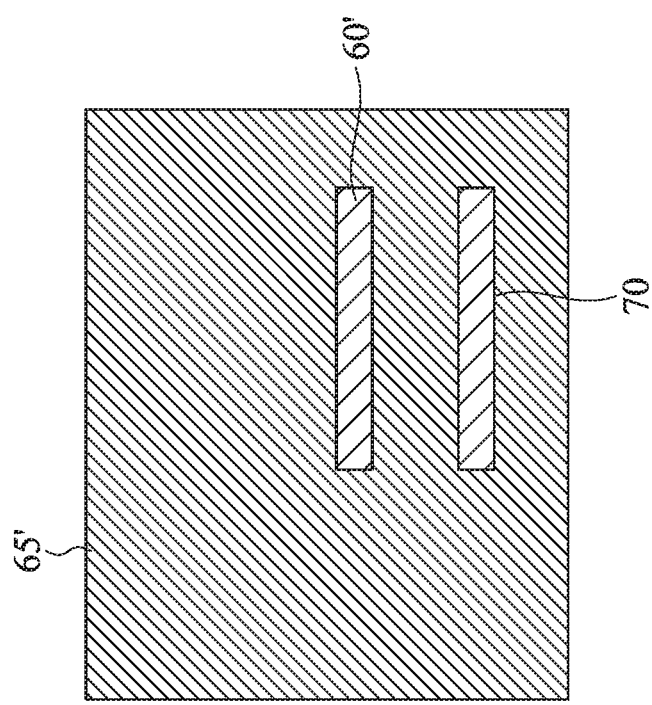
FIG. 4B is a plan view of the stage of the sequential process depicted in FIG. 4A.

A second resist layer 85 is subsequently formed over the mandrel lines 35 and the mandrel underlayer 30, as shown in FIGS. 4A-4C. FIG. 4A is an isometric view of one stage of a sequential process for manufacturing a semiconductor device according to an embodiment of the present disclosure. FIG. 4B is a plan view of the stage of the sequential process depicted in FIG. 4A. FIG. 4C is a cross-sectional view of the stage of the sequential process according to line C-C of FIG. 4A. In some embodiments, the second resist layer 85 is a trilayer resist including a bottom layer 55', middle layer 60', and an upper layer 65', wherein the layer materials and thickness ranges are the same as discussed herein in reference to FIGS. 2A and 2B. In some embodiments, the bottom layer 55' fills the region between the mandrel lines and has a substantially planar upper surface, the middle layer 60' is an anti-reflective layer, and the upper layer 65' is a photoresist. The photoresist upper layer 65' is patterned to form a plurality of openings 70 in the photoresist upper layer using suitable photolithography operations, as shown in FIGS. 4A-4C.

Figure 5A:
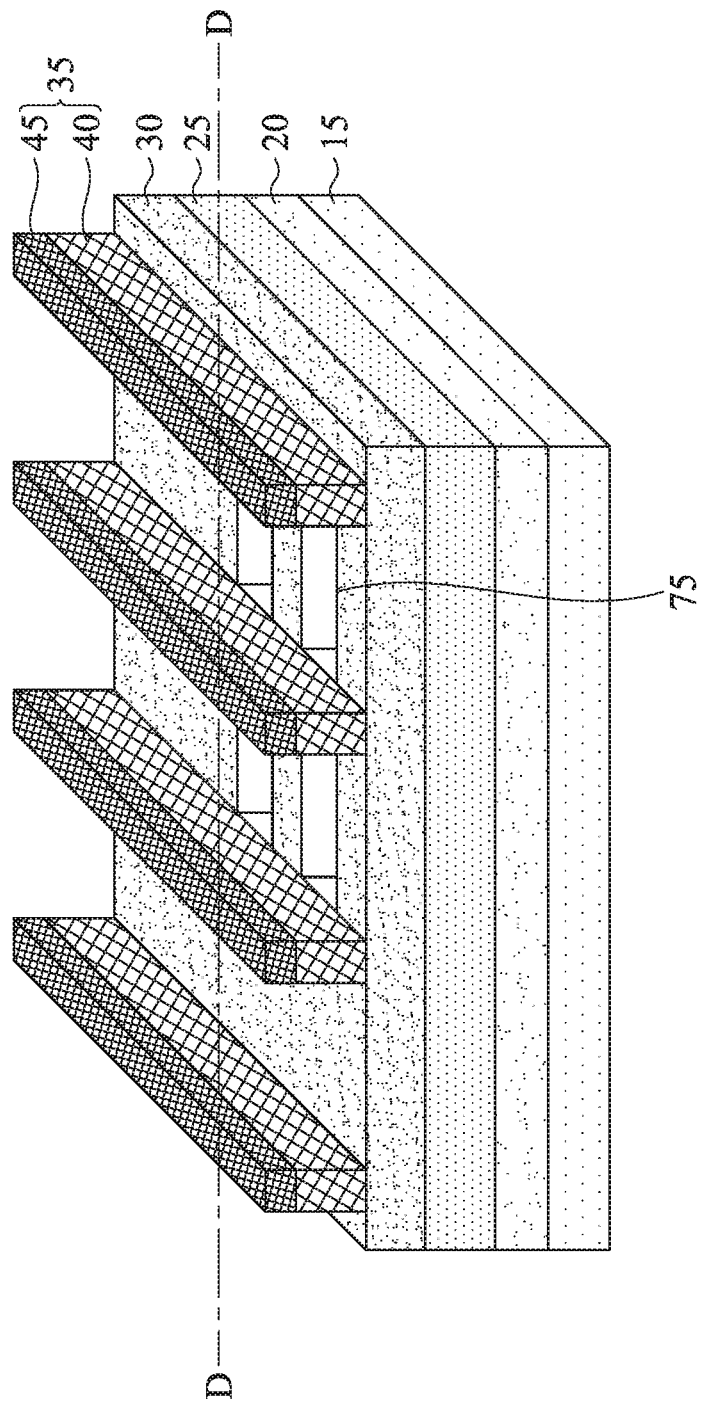
FIG. 5A is an isometric view of one stage of a sequential process for manufacturing a semiconductor device according to an embodiment of the present disclosure.

The openings 70 are extended through the second resist layer 85 to the mandrel underlayer 30 using suitable etching operations, as shown in FIGS. 5A-5C. FIG. 5A is an isometric view of one stage of a sequential process for manufacturing a semiconductor device according to an embodiment of the present disclosure. FIG. 5B is a plan view of the stage of the sequential process depicted in FIG. 5A. FIG. 5C is a cross-sectional view of the stage of the sequential process according to line D-D of FIG. 5A.

Using the second resist layer 85 as a mask, a merge cut is formed in the mandrel underlayer 30 by using one or more etching operations to form a plurality of openings 75 (merge cuts) in the mandrel underlayer 30. The hard mask layer 25 is exposed in the plurality of merge cuts 75. The second resist layer 85 is subsequently removed, using suitable stripping or ashing techniques in some embodiments. The one or more etching operations may include wet etching operations, anisotropic dry etching operations, or combinations thereof. In some embodiments, the etching of the mandrel under layer 30 is a dry etching operation using etch process gases including $O_2$, $CO_2$, $C_xH_yF_z$, Ar, $N_2$, $H_2$, HBr, $Cl_2$, and combinations thereof.

The mandrel underlayer 30, the mandrel layer 35, and the hard mask layer 25 are made of different materials in some embodiments, so that when an etchant selective to the mandrel underlayer 30 is used, the exposed portions of the mandrel layer 35 and the hard mask layer 25 are not etched.

The operations described in FIGS. 4A-4C and 5A-5C can be repeated a plurality of times to create different merge cut patterns.

Figure 6A:
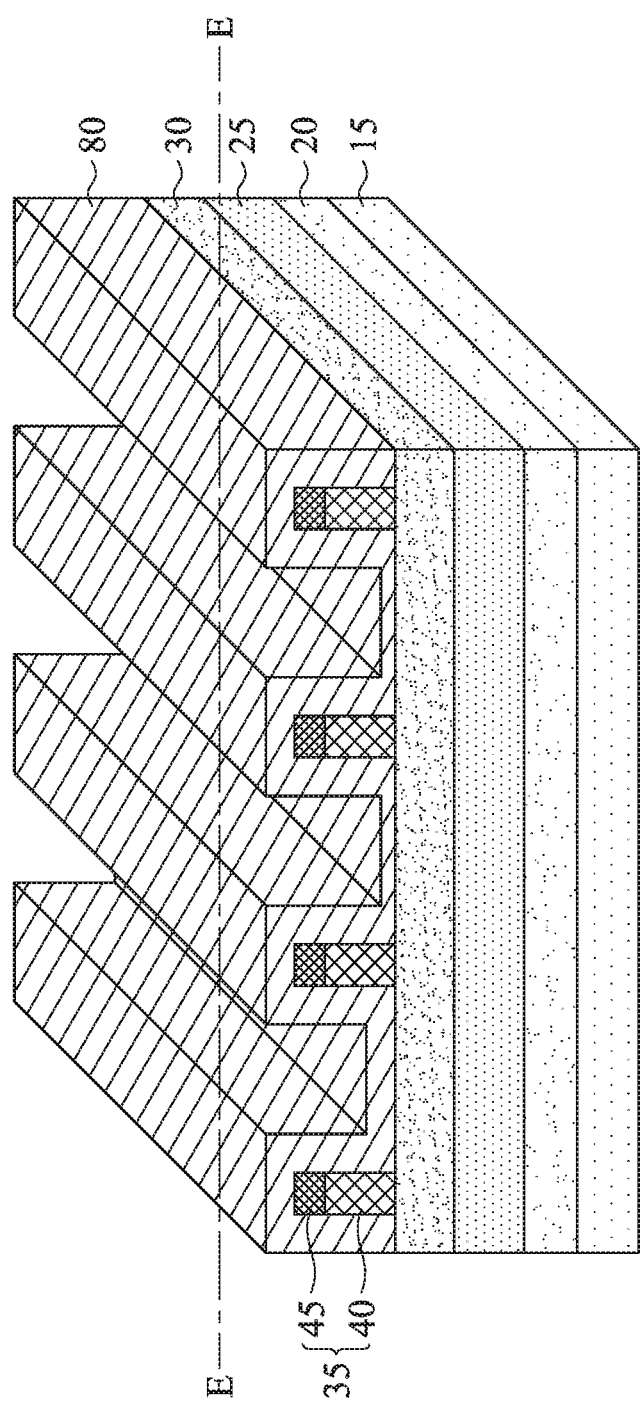
FIG. 6A is an isometric view of one stage of a sequential process for manufacturing a semiconductor device according to an embodiment of the present disclosure.
Figure 6C:
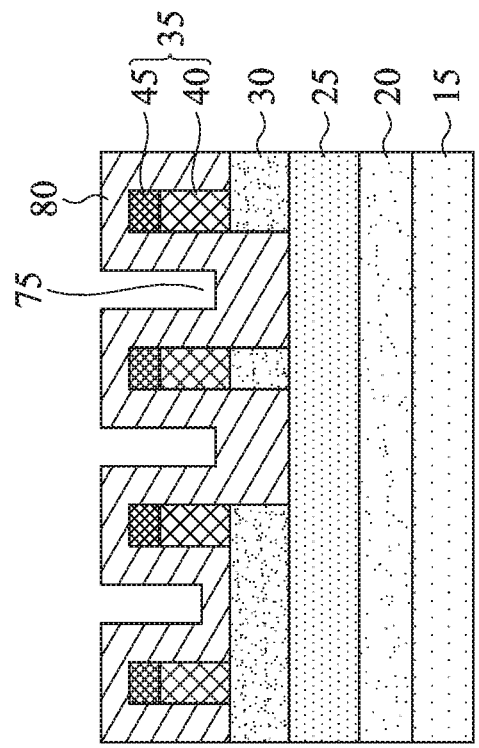
FIG. 6C is a cross-sectional view of the stage of the sequential process according to line E-E of FIG. 6A.
Figure 6B:
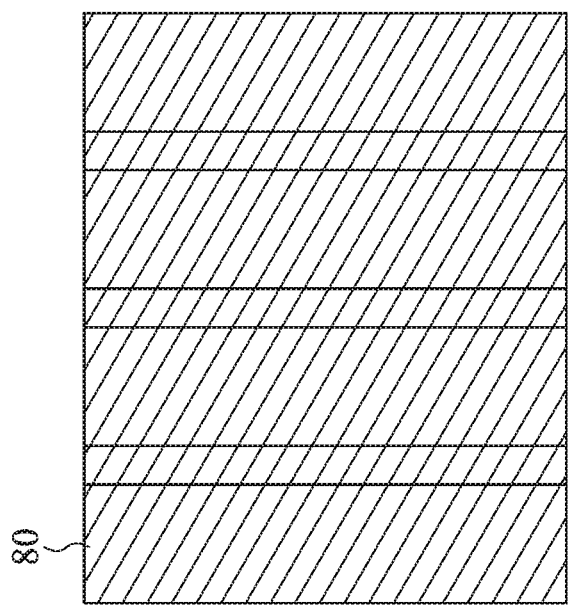
FIG. 6B is a plan view of the stage of the sequential process depicted in FIG. 6A.

A spacer layer 80 is subsequently conformally formed over the mandrel lines 35 and the mandrel underlayer 30, as shown in FIGS. 6A-6C. FIG. 6A is an isometric view of one stage of a sequential process for manufacturing a semiconductor device according to an embodiment of the present disclosure. FIG. 6B is a plan view of the stage of the sequential process depicted in FIG. 6A. FIG. 6C is a cross-sectional view of the stage of the sequential process according to line E-E of FIG. 6A.

The spacer layer 80 is formed of a material selected from the group consisting of a silicon oxide, aluminum oxide, titanium oxide, silicon nitride, titanium nitride, silicon oxynitride, silicon oxycarbide, silicon carbonitride, and combinations thereof in some embodiments. The spacer layer 80 may be deposited by CVD, PECVD, ALD, or PVD. The spacer layer material also fills the openings 75 in the mandrel underlayer 30. The spacer layer deposition merges the cuts (openings).

Figure 7A:
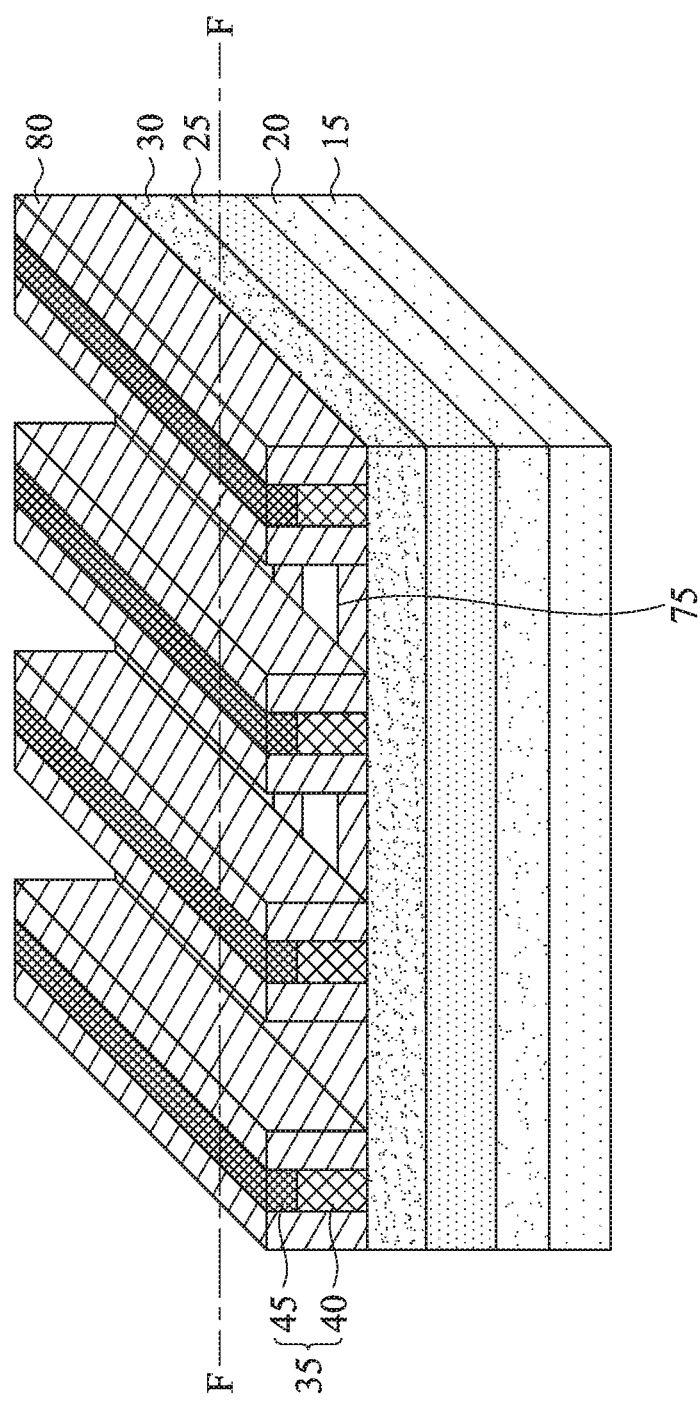
FIG. 7A is an isometric view of one stage of a sequential process for manufacturing a semiconductor device according to an embodiment of the present disclosure.
Figure 7B:
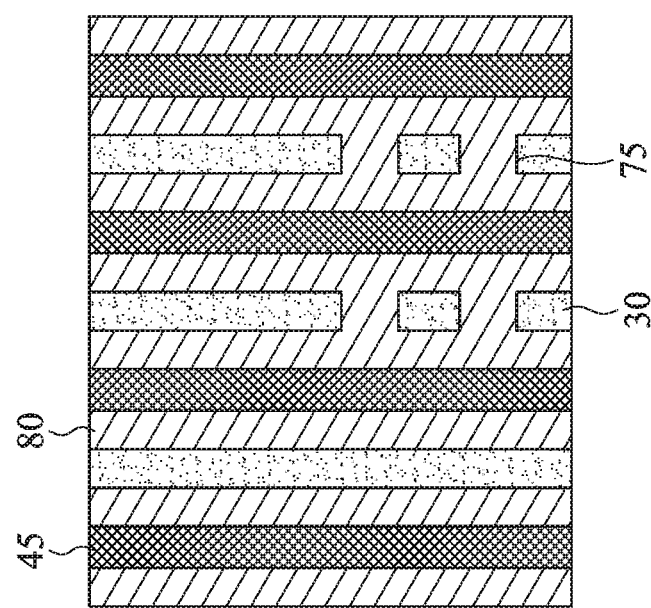
FIG. 7B is a plan view of the stage of the sequential process depicted in FIG. 7A.
Figure 7C:
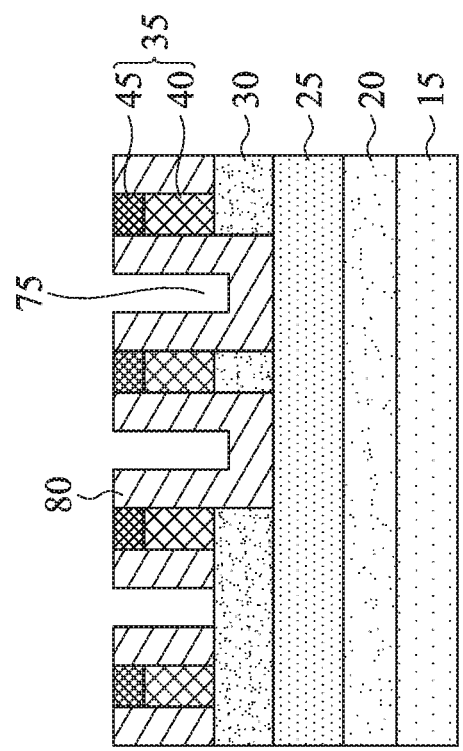
FIG. 7C is a cross-sectional view of the stage of the sequential process according to line F-F of FIG. 7A.

Using anisotropic etching, the spacer layer 80 is subsequently etched thereby exposing the upper surface of the mandrel layer 35, and a portion of the upper surfaces of the mandrel underlayer 30 and the spacer layer material filling the second openings 75 in the mandrel underlayer, as shown in FIGS. 7A-7C. FIG. 7A is an isometric view of one stage of a sequential process for manufacturing a semiconductor device according to an embodiment of the present disclosure. FIG. 7B is a plan view of the stage of the sequential process depicted in FIG. 7A. FIG. 7C is a cross-sectional view of the stage of the sequential process according to line F-F of FIG. 7A. The etching operations may include wet etching operations, anisotropic dry etching operations, or combinations thereof. In some embodiments, the etching of the spacer layer 80 is a dry etching operation using etch process gases including $O_2$, $CO_2$, $C_xH_yF_z$, Ar, $N_2$, $H_2$, HBr, $Cl_2$, and combinations thereof. A portion of the the spacer material 80 remains in the openings 75 after this etching operation, as shown in FIGS. 7A-7C.

Figure 8A:
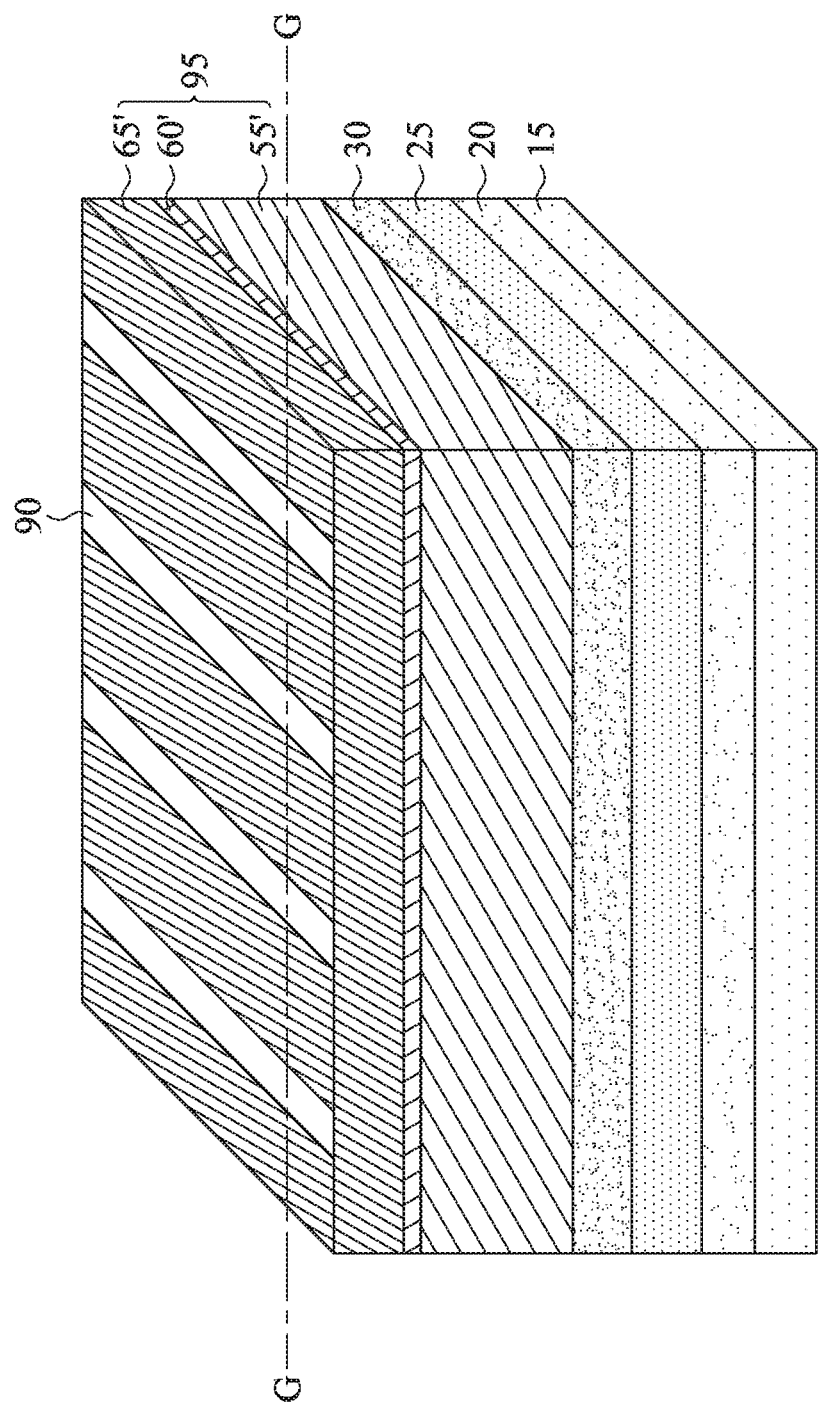
FIG. 8A is an isometric view of one stage of a sequential process for manufacturing a semiconductor device according to an embodiment of the present disclosure.
Figure 8C:
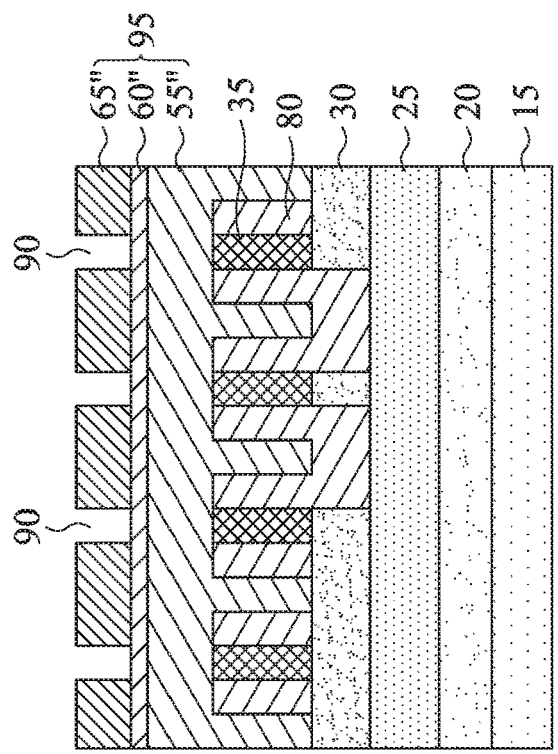
FIG. 8C is a cross-sectional view of the stage of the sequential process according to line G-G of FIG. 8A.
Figure 8B:
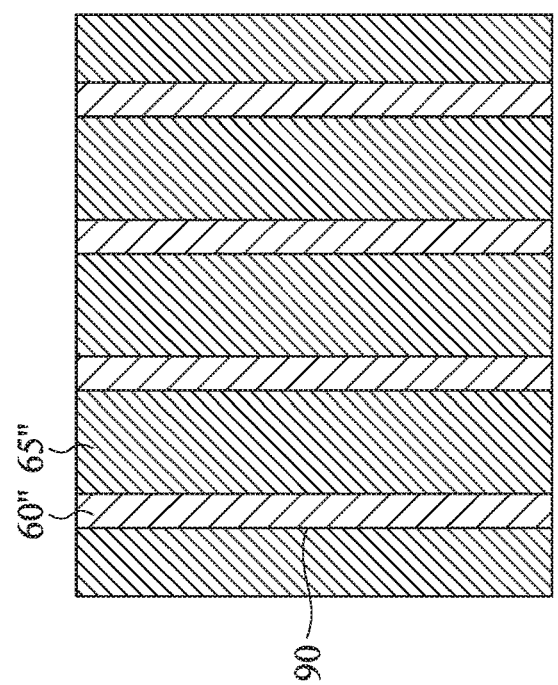
FIG. 8B is a plan view of the stage of the sequential process depicted in FIG. 8A.
Figure 9A:
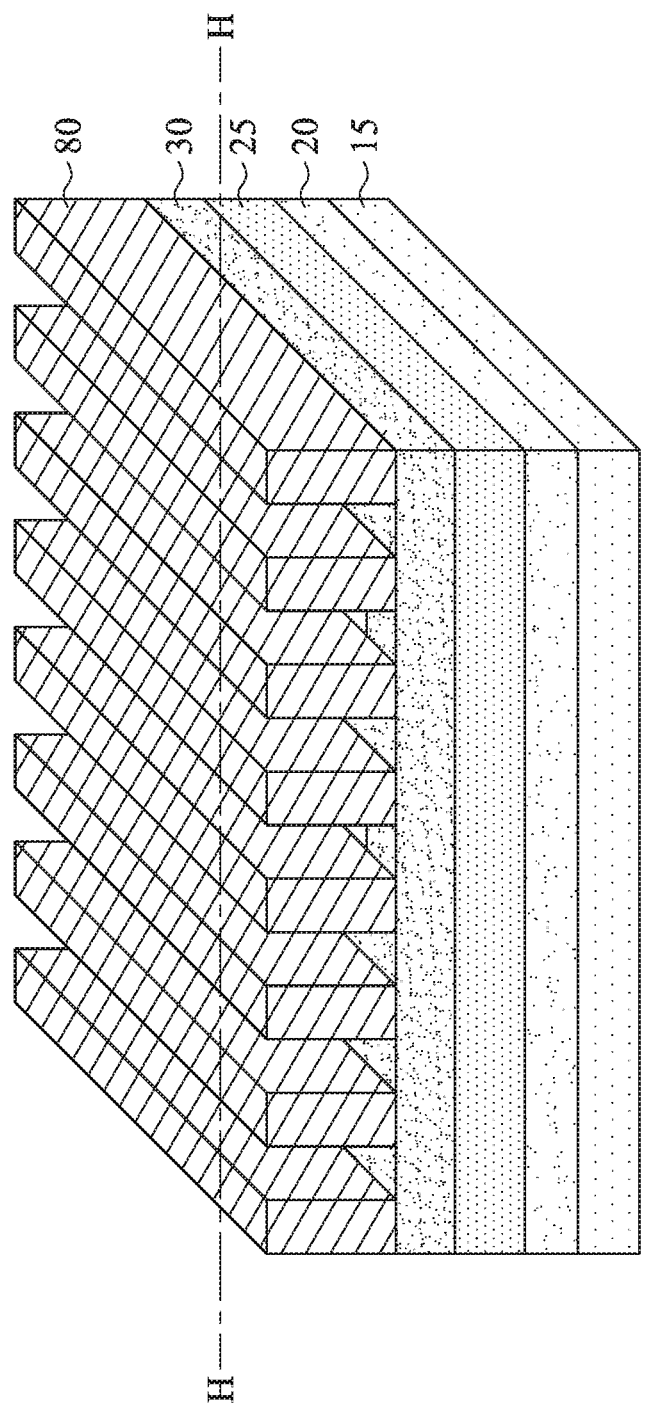
FIG. 9A is an isometric view of one stage of a sequential process for manufacturing a semiconductor device according to an embodiment of the present disclosure.

A third resist layer 95 is subsequently formed over the mandrel layer 35, spacer layer 80, and mandrel underlayer 30, as shown in FIGS. 8A-8C. FIG. 8A is an isometric view of one stage of a sequential process for manufacturing a semiconductor device according to an embodiment of the present disclosure. FIG. 8B is a plan view of the stage of the sequential process depicted in FIG. 8A. FIG. 8C is a cross-sectional view of the stage of the sequential process according to line G-G of FIG. 8A. In some embodiments, the third resist layer 95 is a trilayer resist including a bottom layer 55", middle layer 60", and an upper layer 65", wherein the layer materials and thickness ranges are the same as discussed herein in reference to FIGS. 2A and 2B. In some embodiments, the bottom layer 55" fills the region between the spacers 80 and has a substantially planar upper surface, the middle layer 60" is an anti-reflective layer, and the upper layer 65" is a photoresist. The photoresist upper layer 65" is patterned to form a plurality of openings 90 in the photoresist upper layer 65" using suitable photolithography operations, as shown in FIGS. 8A-8C. The openings 90 are aligned over the mandrel lines 35.

The openings 90 in the photoresist layer 65" are subsequently extended through the middle layer 60" and bottom layer 55", and then using the third resist layer 95 as a mask, the mandrel lines 35 are removed using a suitable etching operation. The etching operations may include wet etching operations, anisotropic dry etching operations, or combinations thereof. In some embodiments, the etching of the mandrel lines 35 is a dry etching operation using etch process gases including $O_2$, $CO_2$, $C_xH_yF_z$, Ar, $N_2$, $H_2$, HBr, $Cl_2$, and combinations thereof. After removing the mandrel lines, the third resist layer 95 is removed by appropriate techniques, such as ashing or stripping, as shown in FIGS.

9A-9C, leaving a plurality of spacer lines 80 on the surface of the mandrel underlayer 30. The etching of the mandrel layer 35 exposes the upper surface of the mandrel underlayer 30 and a portion of the spacer layer 80 filling the merge cuts 75 in the mandrel underlayer 30.

Figure 10A:
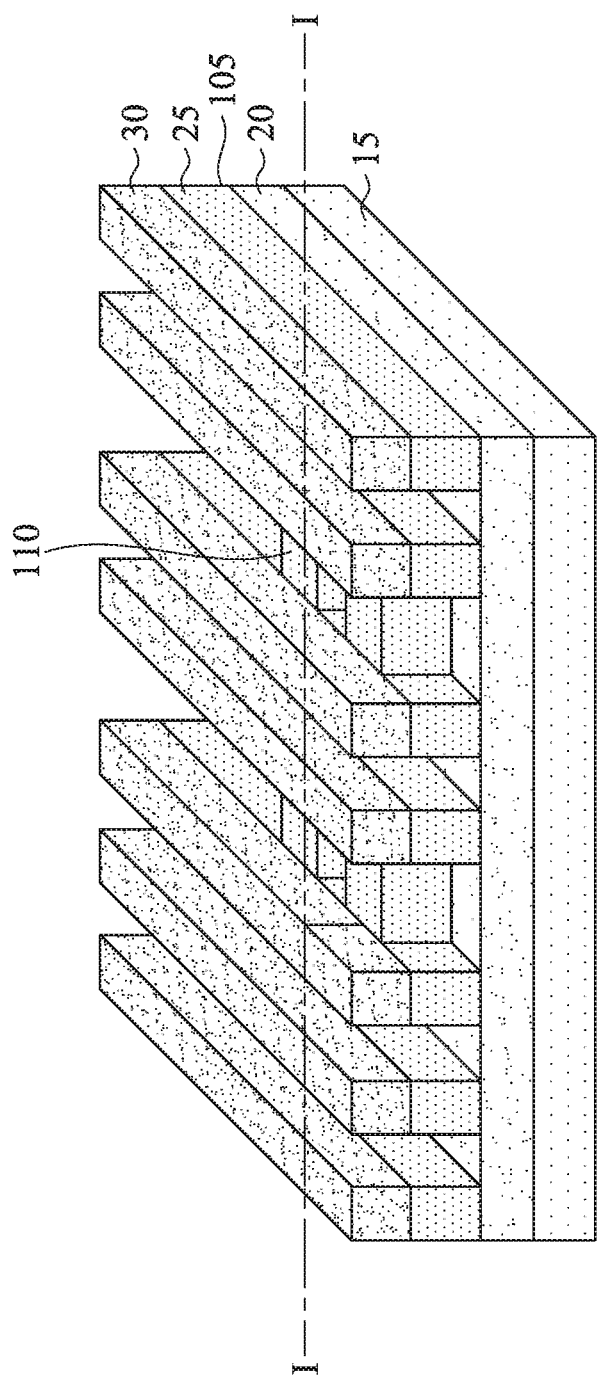
FIG. 10A is an isometric view of one stage of a sequential process for manufacturing a semiconductor device according to an embodiment of the present disclosure.
Figure 10B:
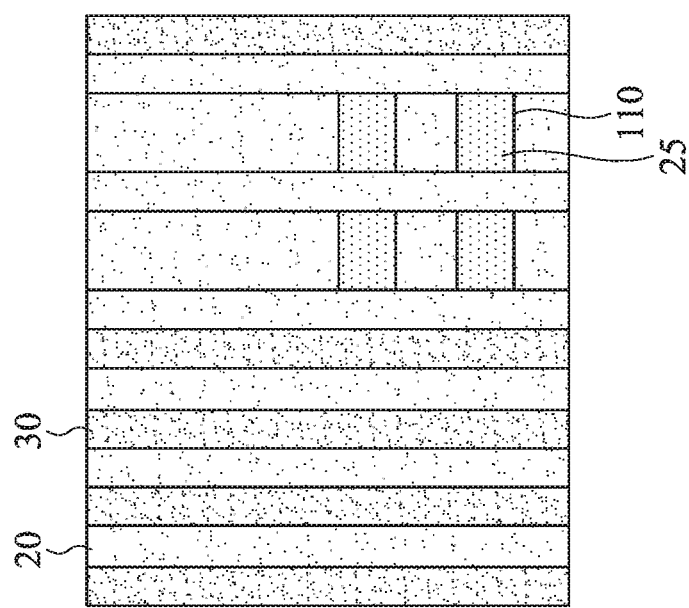
FIG. 10B is a plan view of the stage of the sequential process depicted in FIG. 10A.
Figure 10C:
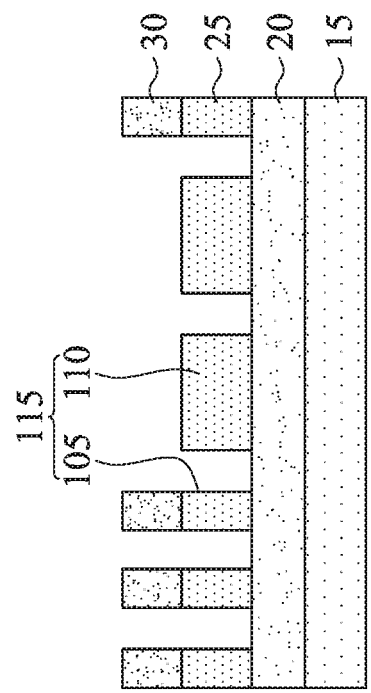
FIG. 10C is a cross-sectional view of the stage of the sequential process according to line I-I of FIG. 10A.

The spacer lines 80 and the merge cuts 75 filled with the spacer material are subsequently used as a mask for one or more etching operations of the mandrel underlayer 30 and hard mask layer 25, thereby forming a hard mask pattern 115 with first hard mask pattern lines 105 extending along the first direction and second hard mask pattern lines 110 extending along the second direction, as shown in FIGS. 10A-10C. FIG. 10A is an isometric view of one stage of a sequential process for manufacturing a semiconductor device according to an embodiment of the present disclosure. FIG. 10B is a plan view of the stage of the sequential process depicted in FIG. 10A. FIG. 10C is a cross-sectional view of the stage of the sequential process according to line I-I of FIG. 10A.

The operations of etching the spacer lines 80, filled merge cuts 75, mandrel underlayer 30, and hard mask layer 25 may include one or more etching operations including, anisotropic dry etching operations, or combinations thereof. In some embodiments, the one or more etching operations are dry etching operations using etch process gases including $O_2$, $CO_2$, $C_xH_yF_z$, Ar, $N_2$, $H_2$, HBr, $Cl_2$, and combinations thereof. The etching operation removes the spacer lines 80 serving as a mask, and the spacer material filling the merge cuts 75. The hard mask layer 25, mandrel underlayer 30, and spacer layer 80 are made of different materials in some embodiments, so that when an etchant selective to the spacer layer 80 is used, the exposed portions of the mandrel under layer 30 and the hard mask layer 25 are not etched, and when an etchant selective to the mandrel under layer 30 is used the hard mask layer 25 is not etched. In addition, the etch stop layer 20 is made of a different material than the hard mask layer 25, so that the etch stop layer 20 is not etched when the hard mask layer 25 is etched.

The hard mask pattern 115 can subsequently used for forming interconnects in certain embodiments. For example, the hard mask pattern 115 can be used in subsequent operations to selectively etch the etch stop layer 20 and interlayer dielectric layer 15 to form vias (not shown) in some embodiments so that electrical contacts can made to devices buried in the device layer 10. After forming the vias, a conductive material is deposited in the vias to contacts and interconnects. The conductive material is subsequently planarized by a chemical-mechanical polishing operation or etch-back operation. The conductive material may be a metal deposited using conventional techniques including PVD, ALD, and electroplating. In certain embodiments, barrier layers, and metal seed layers are deposited in the vias, in addition to the conductive material. In certain embodiments, the barrier layer is a tantalum nitride or titanium nitride layer. In certain embodiments, the conductive material includes aluminum, tungsten, or copper.

It is understood that additional processing may be performed. Subsequent processing according to embodiments of the disclosure may also form various additional contacts/vias/lines and multilayer interconnects features (e.g., metal layers and interlayer dielectrics) on the device, configured to connect the various features or structures of the semiconductor device. For example, a multilayer interconnection includes vertical interconnects, such as conventional vias or contacts, and horizontal interconnects, such as metal lines.

The various embodiments or examples described herein offer several advantages over the existing art. The underlayer merge cut technique of the present disclosure improves the hard mask pattern process window. By improving the hard mask process window, the effects of differences in resist topography caused by differences in the density of underlying pattern features is minimized. The method of the present disclosure reduces short circuit and disconnect defects in back-end of line interconnect structures, thereby increasing device yield.

It will be understood that not all advantages have been necessarily discussed herein, no particular advantage is required for all embodiments or examples, and other embodiments or examples may offer different advantages.

An embodiment of the present disclosure is a method for manufacturing a semiconductor device, including forming a hard mask layer overlying a device layer of a semiconductor device, forming a mandrel underlayer over the hard mask layer, and forming a mandrel layer over the mandrel underlayer. The mandrel layer has a plurality of mandrel lines extending along a first direction. A plurality of openings are formed in the mandrel underlayer extending in a second direction substantially perpendicular to the first direction. A spacer layer is formed over the mandrel underlayer and the mandrel layer. The spacer layer fills the plurality of openings in the mandrel underlayer. Portions of the spacer layer are removed to expose an upper surface of the mandrel underlayer and an upper surface of the mandrel layer, and the mandrel layer is removed. By using remaining portions of the spacer layer as a mask, the mandrel underlayer and the hard mask layer are removed, to form a hard mask pattern with first hard mask pattern lines extending along the first direction and second hard mask pattern lines extending along the second direction. In an embodiment, the forming of the mandrel layer over the mandrel underlayer includes: forming a first mandrel layer over the mandrel underlayer, forming a second mandrel layer over the first mandrel layer, and patterning the first mandrel layer and second mandrel layer to form the plurality of mandrel lines. In an embodiment, the first mandrel layer includes amorphous silicon, amorphous carbon, or aluminum oxynitride, and the second mandrel layer comprises an insulating material. In an embodiment, the insulating material is a silicon oxide, silicon nitride, aluminum oxide, silicon oxycarbide, or SiCOH. In an embodiment, the forming a plurality of openings in the mandrel underlayer extending in a second direction substantially perpendicular to the first direction includes: forming a resist layer over the mandrel layer and the mandrel underlayer, patterning the resist layer to form openings in the resist layer exposing a portion of the mandrel underlayer, etching the exposed portion of the mandrel underlayer to form the plurality of openings in the mandrel underlayer extending in the second direction substantially perpendicular to the first direction, and removing the resist layer. In an embodiment, the resist layer is a trilayer resist including a bottom layer, a middle layer, and an upper layer. In an embodiment, the bottom layer fills the region between the mandrel lines and has a substantially planar upper surface, the middle layer is an anti-reflective layer, and the upper layer is a photoresist. In an embodiment, the spacer layer is conformally formed around the mandrel lines. In an embodiment, the removing the mandrel layer includes: forming a resist layer over the mandrel layer, the spacer layer, and the mandrel underlayer, patterning the resist layer to form openings exposing the mandrel layer, etching the mandrel layer to remove the mandrel layer, and removing the resist layer. In an embodiment, the resist layer is a trilayer resist including a bottom layer filling the region between the mandrel lines, an anti-reflective middle layer, and a photoresist upper layer. In an embodiment, the method includes forming an etch stop layer between the device layer and the hard mask layer. In an embodiment, the mandrel underlayer is made of a material selected from the group consisting of a silicon oxide, silicon nitride, titanium oxide, titanium nitride, and combinations thereof. In an embodiment, the spacer layer is formed of a material selected from the group consisting of a silicon oxide, aluminum oxide, titanium oxide, silicon nitride, titanium nitride, silicon oxynitride, silicon oxycarbide, silicon carbonitride, and combinations thereof.

Another embodiment of the present disclosure is a method for manufacturing a semiconductor device, including forming an interlayer dielectric layer over one or more devices disposed on a semiconductor substrate. A hard mask layer is formed over the interlayer dielectric layer. A mandrel underlayer is formed over the interlayer dielectric layer. A plurality of mandrel lines extending in a first direction are formed over the mandrel underlayer. A merge cut is formed in the mandrel underlayer extending in a second direction substantially perpendicular to the first direction. A spacer layer is formed over the mandrel lines, wherein the spacer layer fills the merge cut. The spacer layer is anisotropically etched to form a plurality of spacers extending in the first direction along the mandrel lines. The mandrel underlayer and the hard mask layer are patterned using the spacers as a mask. The mandrel underlayer, mandrel lines, and hard mask layer are made of different materials. In an embodiment, patterning the mandrel underlayer and the hard mask layer includes performing anisotropic etching to form first hard mask pattern lines extending along the first direction and second hard mask pattern lines extending along the second direction. In an embodiment, an etch stop layer is formed over the interlayer dielectric layer before forming the hard mask layer. In an embodiment, the mandrel lines are made of a material selected from the group consisting of a silicon oxide, silicon nitride, aluminum oxide, SiCOH, silicon oxycarbide, amorphous silicon, amorphous carbon, aluminum oxynitride, and combinations thereof. In an embodiment, the anisotropically etching the spacer layer to form a plurality of spacers exposes an upper surface of the mandrel underlayer and an upper surface of the mandrel lines. In an embodiment, the mandrel underlayer is made of a material selected from the group consisting of a silicon oxide, silicon nitride, titanium oxide, titanium nitride, and combinations thereof.

In another embodiment of the present disclosure, a method for manufacturing a semiconductor device includes forming an interlayer dielectric layer over a device layer having a one or more devices embedded therein. A layer stack is formed over an interlayer dielectric layer, the layer stack includes in order from the interlayer dielectric layer: an etch stop layer, a hard mask layer, a mandrel underlayer, and a mandrel layer. A first resist layer is formed over the layer stack. The first resist layer is patterned, and the pattern in the first resist layer is extended into the mandrel layer to expose a portion of the mandrel underlayer thereby forming a mandrel layer comprising plurality of mandrel lines extending in a first direction. The first resist layer is removed, and a second resist layer is formed. The second resist layer is patterned to form an opening in the second resist layer extending in a second direction substantially perpendicular to the first direction. The pattern in the second resist layer is extended into the mandrel underlayer to expose a portion of the hard mask layer. A conformal spacer layer is formed over the exposed portion of the hard mask layer, mandrel underlayer, and the mandrel layer. Portions of the spacer layer are removed to expose an upper surface of the mandrel underlayer and an upper surface of the mandrel layer. A third resist layer is formed over the mandrel underlayer, mandrel layer, and spacer layer. The third resist layer is patterned to form openings extending over the mandrel lines. The pattern in the third resist layer is extended through the mandrel lines to remove the mandrel layer, and the third resist layer is removed. By using remaining portions of the spacer layer as a mask, the mandrel underlayer and the hard mask layer are patterned, to form a hard mask pattern with first hard mask pattern lines extending along the first direction and second hard mask pattern lines extending along the second direction. The remaining portions of the spacer layer are removed. In an embodiment, the first resist layer, second resist layer, and third resist layer are trilayer resists including a planarizing bottom layer, an anti-reflective middle layer, and a photoresist upper layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a hard mask layer overlying a device layer of a semiconductor device;
    forming a mandrel underlayer over the hard mask layer;
    forming a mandrel layer over the mandrel underlayer, wherein the mandrel layer has a plurality of mandrel lines extending along a first direction;
    forming a plurality of openings in the mandrel underlayer extending in a second direction substantially perpendicular to the first direction;
    forming a spacer layer over the mandrel underlayer and the mandrel layer, wherein the spacer layer fills the plurality of openings in the mandrel underlayer;
    removing portions of the spacer layer to expose an upper surface of the mandrel underlayer and an upper surface of the mandrel layer;
    removing the mandrel layer; and
    patterning, by using remaining portions of the spacer layer as a mask, the mandrel underlayer and the hard mask layer, to form a hard mask pattern with first hard mask pattern lines extending along the first direction and second hard mask pattern lines extending along the second direction.

2. The method according to claim 1, wherein the forming of the mandrel layer over the mandrel underlayer comprises:
    forming a first mandrel layer over the mandrel underlayer;
    forming a second mandrel layer over the first mandrel layer; and
    patterning the first mandrel layer and second mandrel layer to form the plurality of mandrel lines.

3. The method according to claim 2, wherein the first mandrel layer comprises amorphous silicon, amorphous carbon, or aluminum oxynitride, and the second mandrel layer comprises an insulating material.

4. The method according to claim 3, wherein the insulating material is a silicon oxide, silicon nitride, aluminum oxide, silicon oxycarbide, or SiCOH.

5. The method according to claim 1, wherein the forming a plurality of openings in the mandrel underlayer extending in a second direction substantially perpendicular to the first direction comprises:
 forming a resist layer over the mandrel layer and the mandrel underlayer;
 patterning the resist layer to form openings in the resist layer exposing a portion of the mandrel underlayer;
 etching the exposed portion of the mandrel underlayer to form the plurality of openings in the mandrel underlayer extending in the second direction substantially perpendicular to the first direction; and
 removing the resist layer.

6. The method according to claim 5, wherein the resist layer is a trilayer resist including a bottom layer filling the region between the mandrel lines, an anti-reflective middle layer, and a photoresist upper layer.

7. The method according to claim 1, wherein the spacer layer is conformally formed around the mandrel lines.

8. The method according to claim 1, wherein the removing the mandrel layer comprises:
 forming a resist layer over the mandrel layer, the spacer layer, and the mandrel underlayer;
 patterning the resist layer to form openings exposing the mandrel layer;
 etching the mandrel layer to remove the mandrel layer; and
 removing the resist layer.

9. The method according to claim 8, wherein the resist layer is a trilayer resist including a bottom layer filling the region between the mandrel lines, an anti-reflective middle layer, and a photoresist upper layer.

10. The method according to claim 1, further comprising forming an etch stop layer between the device layer and the hard mask layer.

11. The method according to claim 1, wherein the mandrel underlayer is made of a material selected from the group consisting of a silicon oxide, silicon nitride, titanium oxide, titanium nitride, combinations thereof.

12. The method according to claim 1, wherein the spacer layer is formed of a material selected from the group consisting of a silicon oxide, aluminum oxide, titanium oxide, silicon nitride, titanium nitride, silicon oxynitride, silicon oxycarbide, silicon carbonitride, and combinations thereof.

13. A method for manufacturing a semiconductor device, comprising:
 forming an interlayer dielectric layer over one or more devices disposed on a semiconductor substrate;
 forming a hard mask layer over the interlayer dielectric layer;
 forming a mandrel underlayer over the interlayer dielectric layer;
 forming a plurality of mandrel lines extending in a first direction over the mandrel underlayer;
 forming a merge cut in the mandrel underlayer extending in a second direction substantially perpendicular to the first direction;
 forming a spacer layer over the mandrel lines, wherein the spacer layer fills the merge cut;
 anisotropically etching the spacer layer to form a plurality of spacers extending in the first direction along the mandrel lines; and
 patterning the mandrel underlayer and the hard mask layer using the spacers as a mask,
 wherein the mandrel underlayer, mandrel lines, and hard mask layer are made of different materials.

14. The method according to claim 13, wherein the patterning the mandrel underlayer and the hard mask layer comprises performing anisotropic etching to form first hard mask pattern lines extending along the first direction and second hard mask pattern lines extending along the second direction.

15. The method according to claim 13, further comprising forming an etch stop layer over the interlayer dielectric layer before forming the hard mask layer.

16. The method according to claim 13, wherein the mandrel lines are made of a material selected from the group consisting of a silicon oxide, silicon nitride, aluminum oxide, SiCOH, silicon oxycarbide, amorphous silicon, amorphous carbon, aluminum oxynitride, and combinations thereof.

17. The method according to claim 13, wherein the anisotropically etching the spacer layer to form a plurality of spacers exposes an upper surface of the mandrel underlayer and an upper surface of the mandrel lines.

18. The method according to claim 13, wherein the mandrel underlayer is made of a material selected from the group consisting of a silicon oxide, silicon nitride, titanium oxide, titanium nitride, combinations thereof.

19. A method for manufacturing a semiconductor device, comprising:
 forming an interlayer dielectric layer over a device layer having a one or more devices embedded therein;
 forming a layer stack over an interlayer dielectric layer, the layer stack comprising in order from the interlayer dielectric layer:
  an etch stop layer;
  a hard mask layer;
  a mandrel underlayer; and
  a mandrel layer;
 forming a first resist layer over the layer stack;
 patterning the first resist layer;
 extending the pattern in the first resist layer into the mandrel layer to expose a portion of the mandrel underlayer thereby forming a mandrel layer comprising plurality of mandrel lines extending in a first direction;
 removing the first resist layer;
 forming a second resist layer;
 patterning the second resist layer to form an opening in the second resist layer extending in a second direction substantially perpendicular to the first direction;
 extending the pattern in the second resist layer into the mandrel underlayer to expose a portion of the hard mask layer;
 forming a conformal spacer layer over the exposed portion of the hard mask layer, mandrel underlayer, and the mandrel layer;
 removing portions of the spacer layer to expose an upper surface of the mandrel underlayer and an upper surface of the mandrel layer;
 forming a third resist layer over the mandrel underlayer, mandrel layer, and spacer layer;
 patterning the third resist layer to form openings extending over the mandrel lines;
 extending the pattern in the third resist layer through the mandrel lines to remove the mandrel layer;
 removing the third resist layer;
 patterning, by using remaining portions of the spacer layer as a mask, the mandrel underlayer and the hard mask layer, to form a hard mask pattern with first hard mask pattern lines extending along the first direction and second hard mask pattern lines extending along the second direction; and removing the remaining portions of the spacer layer.

20. The method according to claim 19, wherein the first resist layer, second resist layer, and third resist layer are trilayer resists including a planarizing bottom layer, an anti-reflective middle layer, and a photoresist upper layer.

* * * * *